(12) United States Patent
Sperry et al.

(10) Patent No.: US 11,694,047 B2
(45) Date of Patent: Jul. 4, 2023

(54) ENCODING SIGNALS ON FLEXOGRAPHIC PRINTING PLATES TO ENABLE TRACKING AND MANAGEMENT

(71) Applicants: Digimarc Corporation, Beaverton, OR (US); MacDermid Graphics Solutions, LLC, Waterbury, CT (US)

(72) Inventors: Jay Kelly Sperry, Wilmington, NC (US); Ryan W. Vest, Mequon, WI (US)

(73) Assignees: DIGIMARC CORPORATION, Beaverton, OR (US); MACDERMID GRAPHICS SOLUTIONS, LLC, Waterbury, CT (US)

( * ) Notice: Subject to any disclaimer, the term of this patent is extended or adjusted under 35 U.S.C. 154(b) by 5 days.

(21) Appl. No.: 17/389,882

(22) Filed: Jul. 30, 2021

(65) Prior Publication Data

US 2022/0036025 A1 Feb. 3, 2022

Related U.S. Application Data

(60) Provisional application No. 63/113,772, filed on Nov. 13, 2020, provisional application No. 63/059,801, filed on Jul. 31, 2020.

(51) Int. Cl.
*G06K 7/14* (2006.01)
*G06K 7/10* (2006.01)
*B41N 99/00* (2006.01)
*B41N 1/12* (2006.01)

(52) U.S. Cl.
CPC .............. *G06K 7/1417* (2013.01); *B41N 1/12* (2013.01); *B41N 99/00* (2013.01); *G06K 7/10722* (2013.01); *B41P 2200/12* (2013.01)

(58) Field of Classification Search
CPC .................................................... G06K 7/1417
USPC ..................................................... 235/462.11
See application file for complete search history.

(56) References Cited

U.S. PATENT DOCUMENTS

| | | | |
|---|---|---|---|
| 3,265,765 | A | 8/1966 | Holden et al. |
| 3,867,153 | A | 2/1975 | Maclachlan |
| 4,264,705 | A | 4/1981 | Allen |
| 4,320,188 | A | 3/1982 | Heinz et al. |
| 4,323,636 | A | 4/1982 | Chen |
| 4,323,637 | A | 4/1982 | Chen et al. |
| 4,369,246 | A | 1/1983 | Chen et al. |

(Continued)

FOREIGN PATENT DOCUMENTS

| | | |
|---|---|---|
| EP | 9456336 | 11/1991 |
| EP | 9640878 | 3/1995 |

(Continued)

*Primary Examiner* — Toan C Ly
(74) *Attorney, Agent, or Firm* — Carmody Torrance Sandak & Hennessy LLP

(57) ABSTRACT

The present disclosure relates generally to signal encoding for flexographic printing plates. One aspect is a flexographic, photopolymer printing plate having transparent layers to allow encoded signal printed or laser ablated thereon to be detectable from both sides of the printing plate. Another aspect is a flexographic, photopolymer printing plate having an encoded signal formed in a photocured layer. Still another aspect is a system for tracking such printing plates, including managing location, print impression count, location tracking, etc. Other aspects are described as well.

26 Claims, 4 Drawing Sheets

(56) References Cited

U.S. PATENT DOCUMENTS

| | | |
|---|---|---|
| 4,423,135 A | 12/1983 | Chen et al. |
| 4,427,759 A | 1/1984 | Gruetzmacher et al. |
| 4,622,088 A | 11/1986 | Min |
| 5,135,827 A | 8/1992 | Bohm et al. |
| 5,175,072 A | 12/1992 | Martens |
| 5,223,375 A | 6/1993 | Berrier et al. |
| 5,262,275 A | 11/1993 | Fan |
| 5,279,697 A | 1/1994 | Peterson et al. |
| 5,862,260 A | 1/1999 | Rhoads |
| 5,925,500 A | 7/1999 | Yang et al. |
| 6,122,403 A | 9/2000 | Rhoads |
| 6,238,837 B1 | 5/2001 | Fan |
| 6,345,104 B1 | 2/2002 | Rhoads |
| 6,408,082 B1 | 6/2002 | Rhoads et al. |
| 6,449,377 B1 | 9/2002 | Rhoads |
| 6,590,996 B1 | 7/2003 | Reed et al. |
| 6,614,914 B1 | 9/2003 | Rhoads et al. |
| 6,625,297 B1 | 9/2003 | Bradley |
| 6,674,876 B1 | 1/2004 | Hannigan et al. |
| 6,718,046 B2 | 4/2004 | Reed et al. |
| 6,763,123 B2 | 7/2004 | Reed et al. |
| 6,773,859 B2 | 8/2004 | Fan et al. |
| 6,891,959 B2 | 5/2005 | Reed et al. |
| 6,912,295 B2 | 6/2005 | Reed et al. |
| 6,947,571 B1 | 9/2005 | Rhoads et al. |
| 6,988,202 B1 | 1/2006 | Rhoads et al. |
| 7,065,228 B2 | 6/2006 | Brundage |
| 7,072,490 B2 | 7/2006 | Stach |
| 7,076,082 B2 | 7/2006 | Sharma |
| 7,122,295 B2 | 10/2006 | Mengel et al. |
| 7,143,950 B2 | 12/2006 | Jones et al. |
| 7,352,878 B2 | 4/2008 | Reed et al. |
| 7,383,999 B2 | 6/2008 | Bi et al. |
| 7,389,939 B2 | 6/2008 | Jones et al. |
| 7,403,633 B2 | 7/2008 | Brundage et al. |
| 7,412,072 B2 | 8/2008 | Sharma et al. |
| 7,747,656 B2 | 6/2010 | Kudo et al. |
| 7,986,807 B2 | 7/2011 | Stach et al. |
| 8,059,858 B2 | 11/2011 | Brundage et al. |
| 8,543,823 B2 | 9/2013 | Carr et al. |
| 9,117,268 B2 | 8/2015 | Reed |
| 9,182,778 B2 | 11/2015 | Sharma et al. |
| 9,227,394 B2 | 1/2016 | Sumiyoshi |
| 9,380,186 B2 | 6/2016 | Reed et al. |
| 9,401,001 B2 | 7/2016 | Reed et al. |
| 9,449,357 B1 | 9/2016 | Lyons et al. |
| 9,521,291 B2 | 12/2016 | Holub et al. |
| 9,565,335 B2 | 2/2017 | Reed et al. |
| 9,635,378 B2 | 4/2017 | Holub et al. |
| 9,747,656 B2 | 8/2017 | Stach et al. |
| 9,749,607 B2 | 8/2017 | Boles et al. |
| 9,898,793 B2 | 2/2018 | Rodriguez |
| 9,922,220 B2 | 3/2018 | Evans et al. |
| 10,108,087 B2 | 10/2018 | Boukaftane et al. |
| 10,235,731 B2 | 3/2019 | Filler et al. |
| 10,429,736 B2 | 10/2019 | Bryant et al. |
| 10,599,035 B2 | 3/2020 | Boukaftane et al. |
| 10,657,636 B1 | 5/2020 | Lauer et al. |
| 10,783,601 B1 | 9/2020 | Rodriguez et al. |
| 11,233,918 B1 | 1/2022 | Brundage et al. |
| 2006/0117973 A1 | 6/2006 | Zanoli et al. |
| 2006/0124009 A1 | 6/2006 | Markhart |
| 2006/0165311 A1 | 7/2006 | Watson |
| 2010/0119978 A1 | 5/2010 | Vest |
| 2011/0101088 A1 | 5/2011 | Marguerettaz et al. |
| 2016/0275326 A1* | 9/2016 | Falkenstern ......... G06T 1/0021 |
| 2016/0275639 A1 | 9/2016 | Holub et al. |
| 2019/0171856 A1 | 6/2019 | Sharma et al. |
| 2019/0332840 A1 | 10/2019 | Sharma et al. |

FOREIGN PATENT DOCUMENTS

| | | |
|---|---|---|
| EP | 1239329 | 9/2002 |
| GB | 1366769 | 9/1974 |
| WO | 1999/22273 A1 | 5/1999 |
| WO | 9953428 | 10/1999 |
| WO | 0007356 | 2/2000 |
| WO | 0118604 | 3/2001 |
| WO | 0188615 | 11/2001 |
| WO | 2017/050655 A1 | 3/2017 |
| WO | 2019165364 | 8/2019 |

* cited by examiner

ENCODING SIGNALS ON FLEXOGRAPHIC PRINTING PLATES TO ENABLE TRACKING AND MANAGEMENT

RELATED APPLICATION DATA

This application claims the benefit of U.S. Patent Application Nos. 63/059,801, filed Jul. 31, 2020, and 63/113,772, filed Nov. 13, 2020, each of which is hereby incorporated herein by reference.

TECHNICAL FIELD

The present disclosure relates generally to flexographic printing plates and advanced image signal processing involving signal encoding.

BACKGROUND AND SUMMARY

Flexographic printing plates include, e.g., multi-layered structures having photopolymer material in sheet form. Flexographic plates are processed to form 3D relief print elements raised above open areas. Processed plates are mounted around cylindrical plate rollers. Some of MacDermid Graphics Solutions' work in printing plates is reflected in U.S. Pat. Nos. 10,108,087, 10,429,736 and 10,599,035, which are each hereby incorporated herein by reference.

Encoded signals can be represented within a printing plate via relief print elements and/or printed on a layer side of the plate to enable plate identification, tracking, monitoring and/or plate management.

One form of signal encoding is digital watermarking. For purposes of this disclosure, the terms "digital watermark," "watermark," "data encoding" and "data hiding" are used interchangeably. We sometimes use the terms "encoding," "encode," "embedding," "embed," and "data hiding" to mean modulating (or transforming) data or physical surfaces to include information therein. For example, data encoding embeds an information signal (e.g., a plural bit payload or a modified version of such, e.g., a 2-D error corrected, spread spectrum signal) in a host signal. This can be accomplished, e.g., by modulating a host signal (e.g., image, video or audio) in some fashion to carry the information signal. The modulated signal can then be printed onto a surface or used to guide a relief forming process.

Some of Digimarc Corporation's work in signal encoding, data hiding, and digital watermarking is reflected, e.g., in U.S. Pat. Nos. 6,947,571; 6,912,295; 6,891,959, 6,763,123; 6,718,046; 6,614,914; 6,590,996; 6,408,082; 6,122,403 and 5,862,260, and in published specifications WO 9953428 and WO 0007356 (corresponding to U.S. Pat. Nos. 6,449,377 and 6,345,104). Each of these patent documents is hereby incorporated by reference herein in its entirety.

One aspect of the disclosure is a flexographic, photopolymer printing plate having a plurality of transparent layers. The plurality of transparent layers including a support layer and a photocurable layer, in which the support layer and the photocurable layer each comprise a bottom side and a top side, with the top side of the support layer being adjacently arranged with the bottom layer of the photocurable layer. The flexographic, photopolymer printing plate further comprises an encoded signal printed with UV curable ink or laser ablated therein. In one case, the encoded signal is arranged in a pattern on the bottom side of the support layer. In another case, the encoded signal is arranged in a pattern on the top side of the support layer. The encoded signal comprises an orientation signal component and a plural-bit message component, in which the plural-bit message component is detectable from imagery representing the pattern captured through the top side of the photocurable layer and detectable from imagery representing the pattern captured from the bottom side of the support layer.

The photocurable layer may include an unexposed photocurable layer.

The orientation signal component may include a pattern detectable in a transform domain.

The pattern may include a sparse mark pattern, in which elements of the sparse mark pattern occur when the orientation component and the message component including cooperating components.

The plurality of transparent layers may further include a protective layer comprising a top side and a bottom side, with the bottom side of the protective layer adjacently arranged with the top side of the photocurable layer. In such a case, the plural-bit message component is detectable from imagery representing the pattern captured through the top side of the protective layer and detectable from imagery representing the pattern captured from the bottom side of the support layer.

The plural-bit message component may include a plurality of data fields comprising at least a plate identifier.

The photocurable layer may include multiple layers.

In some implementations, the UV curable ink is printed with piezo drop on-demand printheads.

The encoded signal may be redundantly printed, or laser ablated, on the bottom side or top side of the support layer, with each redundantly instance of the encoded signal comprising the orientation component and the plural-bit message component.

Another aspect of the disclosure comprises a flexographic, photopolymer printing plate having a plurality of transparent layers, the plurality of transparent layers including a support layer and a photocured layer. The support layer and the photocured layer each comprise a bottom side and a top side, with the top side of the support layer being adjacently arranged with the bottom layer of the photocured layer. The flexographic, photopolymer printing plate further comprises an encoded signal carried with raised image elements in the photocured layer, the encoded signal arranged in a pattern and comprising an orientation signal component and a plural-bit message component, in which the plural-bit message component is detectable from imagery representing the pattern captured through the top side of the photocured layer and detectable from imagery representing the pattern captured from the bottom side of the support layer.

In some implementations, the encoded signal is carried with raised image elements and open areas within the photocured layer.

The encoded signal may be formed in or adjacent to a control strip region outside of an image region of the printing plate.

The orientation signal component may include a pattern detectable in a transform domain.

The encoded signal may be redundantly provided within the photocured layer, with each redundantly instance of the encoded signal comprising the orientation component and the plural-bit message component.

According to another aspect of the disclosure, a method is provided for tracking the above printing plates. The method includes: using a camera system, capturing imagery the flexographic, photopolymer printing plate; analyzing captured imagery to decode the plural-bit message component, in which said analyzing utilizes the orientation component to resolve scale and orientation of the encoded signal; accessing a data record with the plural-bit message component; and through a graphical user interface updating the data record to reflect station location, print impression count, print job or customer information.

Additional aspects, features, combinations and technology will be readily apparent from the following description with reference to the accompanying drawings.

DETAILED DESCRIPTION

Introduction:

The following detailed description is divided into four (4) general sections. It should be understood from the outset, however, that we expressly contemplate combining subject matter from one such section with one or more of the other sections. Thus, the sections and section headings are provided for the reader's convenience and are not intended to impose restrictions or limitations. The sections include: I. Signal Encoder and Decoder; II. Printing Plate Technology; III. Encoding Signals on Printing Plates to Enable Identification, Tracking and Management; and IV. Operating Environments.

I. Signal Encoder and Decoder

Encoder/Decoder

Figure 1:
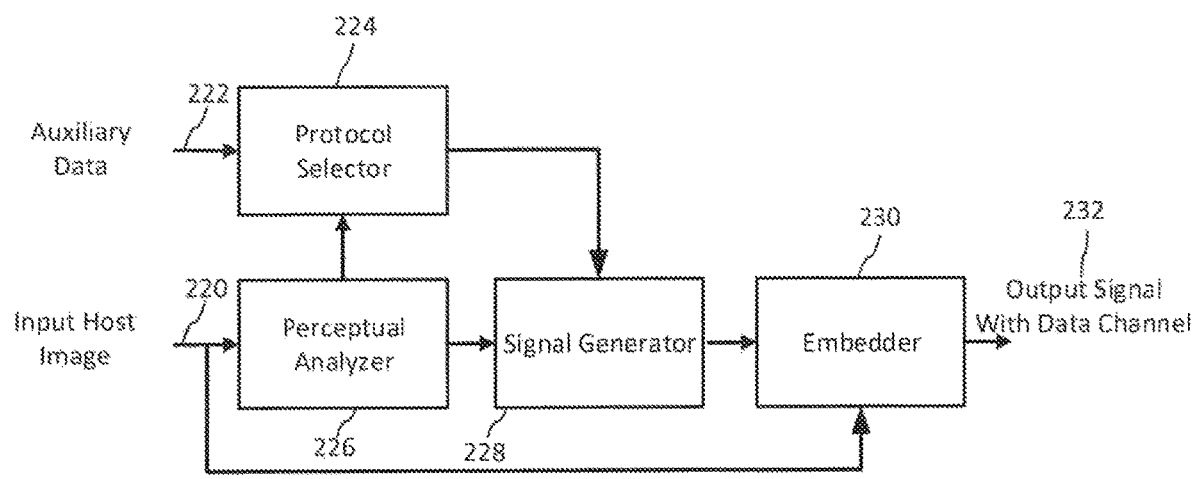
FIG. 1 is a block diagram of a signal encoder for encoding a digital payload signal into an image signal.
Figure 2:
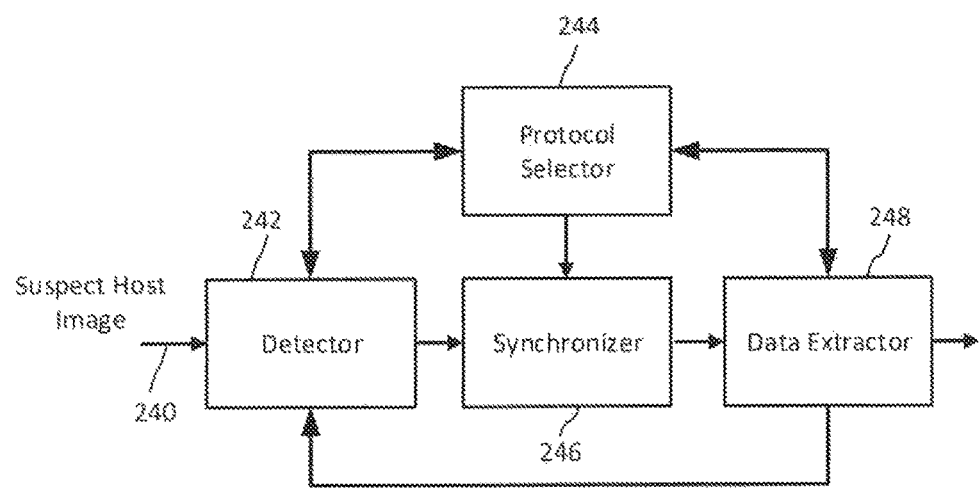
FIG. 2 is a block diagram of a compatible signal decoder for extracting the digital payload signal from an image signal.

FIG. 1 is a block diagram of a signal encoder for encoding a digital payload signal into an image signal. FIG. 2 is a block diagram of a compatible signal decoder for extracting the digital payload signal from an image signal.

While the signal encoder and decoder may be used for communicating a data channel for many applications, one objective for use in physical objects is robust signal communication through images formed on and captured from these objects. Signal encoders and decoders, like those in the Digimarc Barcode Platform from Digimarc Corporation, communicate auxiliary data in a data carrier within image content. Encoding and decoding is applied digitally, yet the signal survives digital to analog transformation and analog to digital transformation. For example, the encoder generates a modulated digital image that is converted to a rendered form, such as a printed image. The modulated digital image includes the encoded signal prior to rendering. Prior to decoding, a receiving device has or communicates with an imager to capture the modulated signal, convert it to an electric signal, which is digitized and then processed by the FIG. 2 signal decoder.

Inputs to the signal encoder include a host image 220 and auxiliary data payload 222. The objectives of the encoder include encoding a robust signal with desired payload capacity per unit of host signal (e.g., a unit may include the spatial area of a two-dimensional tile within the host signal), while maintaining perceptual quality. In some cases, there may be very little variability or presence of a host signal. In this case, there is little host interference on the one hand, yet little host content in which to mask the presence of the data channel within an image. Some examples include a package design that is devoid of much image variability (e.g., a single, uniform color). See, e.g., U.S. Pat. No. 9,635,378, incorporated herein by reference in its entirety.

The auxiliary data payload 222 includes the variable data information to be conveyed in the data channel, possibly along with other protocol data used to facilitate the communication. The protocol of the auxiliary data encoding scheme comprises the format of the auxiliary data payload, error correction coding schemes, payload modulation methods (such as the carrier signal, spreading sequence, encoded payload scrambling or encryption key), signal structure (including mapping of modulated signal to embedding locations within a tile), error detection in payload (CRC, checksum, etc.), perceptual masking method, host signal insertion function (e.g., how auxiliary data signal is embedded in or otherwise combined with host image signal in a package or label design), and/or synchronization method and signals.

The protocol defines the manner in which the signal is structured and encoded for robustness, perceptual quality and/or data capacity. For a particular application, there may be a single protocol, or more than one protocol, depending on application requirements. Examples of multiple protocols include cases where there are different versions of the channel, different channel types (e.g., several digital watermark layers within a host). Different versions may employ different robustness encoding techniques or different data capacity. Protocol selector module 224 determines the protocol to be used by the encoder for generating a data signal. It may be programmed to employ a particular protocol depending on the input variables, such as user control, application specific parameters, or derivation based on analysis of the host signal.

Perceptual analyzer module 226 analyzes the input host signal to determine parameters for controlling signal generation and embedding, as appropriate. It is not necessary in certain applications, while in others it may be used to select a protocol and/or modify signal generation and embedding operations. For example, when encoding in host color images that will be printed or displayed, the perceptual analyzer 226 is used to ascertain color content and masking capability of the host image. The output of this analysis, along with the rendering method (display or printing device) and rendered output form (e.g., ink and substrate) is used to control auxiliary signal encoding in particular color channels (e.g., one or more channels of process inks, Cyan, Magenta, Yellow, or Black (CMYK) or spot colors), perceptual models, and signal protocols to be used with those channels. Please see, e.g., the visibility and color model technology used in perceptual analysis in U.S. Pat. Nos. 7,352,878, 9,117,268, 9,380,186, 9,401,001 and 9,449,357, which are hereby incorporated by reference in their entirety.

The perceptual analyzer module 226 also computes a perceptual model, as appropriate, to be used in controlling the modulation of a data signal onto a data channel within image content as described below.

The signal generator module 228 operates on the auxiliary data and generates a data signal according to the protocol. It may also employ information derived from the host signal, such as that provided by perceptual analyzer module 226, to generate the signal. For example, the selection of data code signal and pattern, the modulation function, and the amount of signal to apply at a given embedding location may be adapted depending on the perceptual analysis, and in particular on the perceptual model and perceptual mask that it generates. Please see below and the incorporated patent documents for additional aspects of this process.

Embedder module 230 takes the data signal and modulates it into an image by combining it with the host image. The operation of combining may be an entirely digital signal processing operation, such as where the data signal modulates the host signal digitally, may be a mixed digital and analog process or may be purely an analog process (e.g., where rendered output images, with some signals being modulated data and others being host image content, such as the various layers of a package design file).

There are a variety of different functions for combining the data and host in digital operations. One approach is to adjust the host signal value as a function of the corresponding data signal value at an embedding location, which is limited or controlled according to the perceptual model and a robustness model for that embedding location. The adjustment may be altering the host image by adding a scaled data signal or multiplying by a scale factor dictated by the data signal value corresponding to the embedding location, with weights or thresholds set on the amount of the adjustment according to the perceptual model, robustness model, and/or available dynamic range. The adjustment may also be altering by setting the modulated host signal to a particular level (e.g., quantization level) or moving it within a range or bin of allowable values that satisfy a perceptual quality or robustness constraint for the encoded data.

As detailed further below, the signal generator 228 produces a data signal with data elements that are mapped to embedding locations in an image tile. These data elements are modulated onto the host image at the embedding locations. A tile may include a pattern of embedding locations. The tile derives its name from the way in which it is repeated in contiguous blocks of a host signal, but it need not be arranged this way. In image-based encoders, we may use tiles in the form of a two dimensional array (e.g., 128×128, 256×256, 512×512) of embedding locations. The embedding locations correspond to host signal samples at which an encoded signal element is embedded in an embedding domain, such as a spatial domain (e.g., pixels at a spatial resolution), frequency domain (frequency components at a frequency resolution), or some other feature space. We sometimes refer to an embedding location as a bit cell, referring to a unit of data (e.g., an encoded bit or chip element) encoded within a host signal at the location of the cell. Again, please see the documents incorporated herein for more information on variations for particular type of media.

The operation of combining may include one or more iterations of adjustments to optimize the modulated host for perceptual quality or robustness constraints. One approach, for example, is to modulate the host image so that it satisfies a perceptual quality metric as determined by perceptual model (e.g., visibility model) for embedding locations across the signal. Another approach is to modulate the host image so that it satisfies a robustness metric across the signal. Yet another is to modulate the host image according to both the robustness metric and perceptual quality metric derived for each embedding location. The incorporated documents provide examples of these techniques. Below, we highlight a few examples. See, e.g., U.S. Pat. No. 9,449,357; and see also, U.S. Pat. No. 9,401,001 and U.S. Pat. No. 9,565,335, which are each hereby incorporated by reference in its entirety.

For color images, the perceptual analyzer generates a perceptual model that evaluates visibility of an adjustment to the host by the embedder and sets levels of controls to govern the adjustment (e.g., levels of adjustment per color direction, and per masking region). This may include evaluating the visibility of adjustments of the color at an embedding location (e.g., units of noticeable perceptual difference in color direction in terms of CIE Lab values), Contrast Sensitivity Function (CSF), spatial masking model (e.g., using techniques described by Watson in US Published Patent Application No. US 2006-0165311 A1, which is incorporated by reference herein in its entirety), etc. One way to approach the constraints per embedding location is to combine the data with the host at embedding locations and then analyze the difference between the encoded host with the original. The perceptual model then specifies whether an adjustment is noticeable based on the difference between a visibility threshold function computed for an embedding location and the change due to embedding at that location. The embedder then can change or limit the amount of adjustment per embedding location to satisfy the visibility threshold function. Of course, there are various ways to compute adjustments that satisfy a visibility threshold, with different sequence of operations. See, e.g., U.S. Pat. Nos. 7,352,878, 9,117,268, 9,380,186, 9,401,001 and 9,449,357, US A1, already incorporated herein.

The Embedder also computes a robustness model. The computing of a robustness model may include computing a detection metric for an embedding location or region of locations. The approach is to model how well the decoder will be able to recover the data signal at the location or region. This may include applying one or more decode operations and measurements of the decoded signal to determine how strong or reliable the extracted signal. Reliability and strength may be measured by comparing the extracted signal with the known data signal. Below, we detail several decode operations that are candidates for detection metrics within the embedder. One example is an extraction filter which exploits a differential relationship to recover the data signal in the presence of noise and host signal interference. At this stage of encoding, the host interference is derivable by applying an extraction filter to the modulated host. The extraction filter models data signal extraction from the modulated host and assesses whether the differential relationship needed to extract the data signal reliably is maintained. If not, the modulation of the host is adjusted so that it is.

Detection metrics may be evaluated such as by measuring signal strength as a measure of correlation between the modulated host and variable or fixed data components in regions of the host or measuring strength as a measure of correlation between output of an extraction filter and variable or fixed data components. Depending on the strength measure at a location or region, the embedder changes the amount and location of host signal alteration to improve the correlation measure. These changes may be particularly tailored so as to establish relationships of the data signal within a particular tile, region in a tile or bit cell pattern of the modulated host. To do so, the embedder adjusts bit cells that violate the relationship so that the relationship needed to encode a bit (or M-ary symbol) value is satisfied and the thresholds for perceptibility are satisfied. Where robustness constraints are dominant, the embedder will exceed the perceptibility threshold where necessary to satisfy a desired robustness threshold.

The robustness model may also model distortion expected to be incurred by the modulated host, apply the distortion to the modulated host, and repeat the above process of measuring detection metrics and adjusting the amount of alterations so that the data signal will withstand the distortion. See, e.g., U.S. Pat. Nos. 9,380,186, 9,401,001 and 9,449,357 for image related processing.

This modulated host is then output as an output image signal 232, with a data channel encoded in it. The operation of combining also may occur in the analog realm where the data signal is transformed to a rendered form, such as a layer of ink or coating applied by a commercial press to substrate. Another example is a data signal that is overprinted as a layer of material, engraved in, or etched onto a substrate, where it may be mixed with other signals applied to the substrate by similar or other marking methods. In these cases, the embedder employs a predictive model of distortion and host signal interference and adjusts the data signal strength so that it will be recovered more reliably.

The predictive modeling can be executed by a classifier that classifies types of noise sources or classes of host image and adapts signal strength and configuration of the data pattern to be more reliable to the classes of noise sources and host image signals that the encoded data signal is likely to be encounter or be combined with.

The output 232 from the Embedder signal typically incurs various forms of distortion through its distribution or use. For printed objects, this distortion occurs through rendering an image with the encoded signal in the printing process, and subsequent scanning back to a digital image via a camera or like image sensor.

Turning to FIG. 2, the signal decoder receives an encoded host signal 240 and operates on it with one or more processing stages to detect a data signal, synchronize it, and extract data.

The decoder is paired with an input device in which a sensor captures an analog form of the signal and an analog to digital converter converts it to a digital form for digital signal processing. Though aspects of the decoder may be implemented as analog components, e.g., such as preprocessing filters that seek to isolate or amplify the data channel relative to noise, much of the decoder is implemented as digital signal processing modules that implement the signal processing operations within a scanner. As noted, these modules can be implemented as software instructions executed within an image scanner or camera, an FPGA, or ASIC, etc.)

The detector 242 is a signal processing module that detects presence of the data channel. The incoming signal is referred to as a suspect host because it may not have a data channel or may be so distorted as to render the data channel undetectable. The detector is in communication with a protocol selector 244 to get the protocols it uses to detect the data channel. It may be configured to detect multiple protocols, either by detecting a protocol in the suspect signal and/or inferring the protocol based on attributes of the host signal or other sensed context information. A portion of the data signal may have the purpose of indicating the protocol of another portion of the data signal. As such, the detector is shown as providing a protocol indicator signal back to the protocol selector 244.

The synchronizer module 246 synchronizes the incoming signal to enable data extraction. Synchronizing includes, for example, determining the distortion to the host signal and compensating for it. This process provides the location and arrangement of encoded data elements within the host signal.

The data extractor module 248 gets this location and arrangement and the corresponding protocol and demodulates a data signal from the host. The location and arrangement provide the locations of encoded data elements. The extractor obtains estimates of the encoded data elements and performs a series of signal decoding operations.

As detailed in examples below and in the incorporated documents, the detector, synchronizer and data extractor may share common operations, and in some cases may be combined. For example, the detector and synchronizer may be combined, as initial detection of a portion of the data signal used for synchronization indicates presence of a candidate data signal, and determination of the synchronization of that candidate data signal provides synchronization parameters that enable the data extractor to apply extraction filters at the correct orientation, scale and start location of a tile. Similarly, data extraction filters used within data extractor may also be used to detect portions of the data signal within the detector or synchronizer modules. The decoder architecture may be designed with a data flow in which common operations are re-used iteratively, or may be organized in separate stages in pipelined digital logic circuits so that the host data flows efficiently through the pipeline of digital signal operations with minimal need to move partially processed versions of the host data to and from a shared memory unit, such as a RAM memory.

Signal Generator

Figure 3:
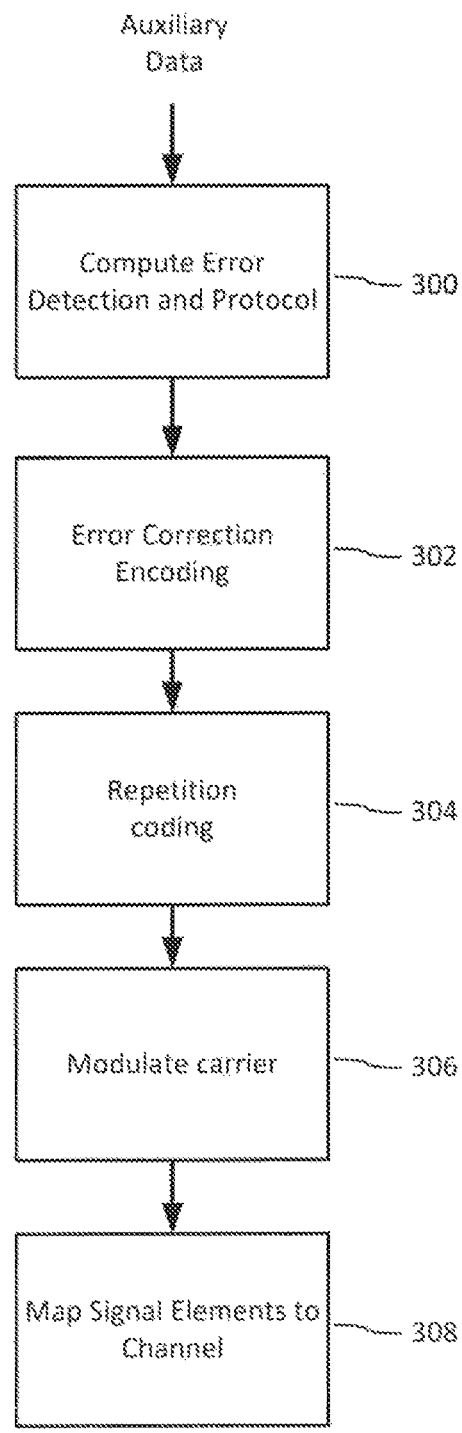
FIG. 3 is a flow diagram illustrating operations of a signal generator.

FIG. 3 is a flow diagram illustrating operations of a signal generator. Each of the blocks in the diagram depict processing modules that transform the input auxiliary data into a digital payload data signal structure. The input auxiliary data may include, e.g., a Global Trade Item Number (GTIN) developed by GS1. For example, the GTIN may be structured in the GTIN-12 format for UPC codes. Of course, the input auxiliary data may represent other plural bit codes as well. For a given protocol, each block provides one or more processing stage options selected according to the protocol. In processing module 300, the auxiliary data payload is processed to compute error detection bits, e.g., such as a Cyclic Redundancy Check (CRC), Parity, check sum or like error detection message symbols. Additional fixed and variable messages used in identifying the protocol and facilitating detection. such as synchronization signals may be added at this stage or subsequent stages.

Error correction encoding module 302 transforms the message symbols of the digital payload signal into an array of encoded message elements (e.g., binary or M-ary elements) using an error correction method. Examples include block codes, BCH, Reed Solomon, convolutional codes, turbo codes, etc.

Repetition encoding module 304 repeats and concatenates the string of symbols from the prior stage to improve robustness. For example, certain message symbols may be repeated at the same or different rates by mapping them to multiple locations within a unit area of the data channel (e.g., one unit area being a tile of bit cells, as described further below).

Repetition encoding may be removed and replaced entirely with error correction coding. For example, rather than applying convolutional encoding (⅓ rate) followed by repetition (repeat three times), these two can be replaced by convolution encoding to produce a coded payload with approximately the same length.

Next, carrier modulation module 306 takes message elements of the previous stage and modulates them onto corresponding carrier signals. For example, a carrier might be an array of pseudorandom signal elements, with equal number of positive and negative elements (e.g., 16, 32, 64 elements), or other waveform, such as sine wave or orthogonal array. In the case of positive and negative elements, the payload signal is a form of binary antipodal signal. It also may be formed into a ternary (of 3 levels, −1, 0, 1) or M-ary signal (of M levels). These carrier signals may be mapped to spatial domain locations or spatial frequency domain locations. Another example of carrier signals are sine waves, which are modulated using a modulation scheme like phase shifting, phase quantization, and/or on/off keying. In one embodiment, carrier modulation module XORs each bit of a scrambled signature with a string of 16 binary elements (a "spreading key"), yielding 16 "chips" having "0" and "1" values. If error correction encoding yields a signature of 1024 bits (which can then be randomized), then the carrier modulation module 306 produces 16,384 output chips.

Mapping module 308 maps signal elements of each modulated carrier signal to locations within the channel. In the case where a digital host signal is provided, the locations correspond to embedding locations within the host signal. The embedding locations may be in one or more coordinate system domains in which the host signal is represented within a memory of the signal encoder. The locations may correspond to regions in a spatial domain, temporal domain, frequency domain, or some other transform domain. Stated another way, the locations may correspond to a vector of host signal features, which are modulated to encode a data signal within the features.

Mapping module 308 also maps a synchronization signal to embedding locations within the host signal, for embodiments employing an explicit synchronization signal. An explicit synchronization signal is described further below.

To accurately recover the payload, the decoder extracts estimates of the coded bits at the embedding locations within each tile. This requires the decoder to synchronize the image under analysis to determine the embedding locations. For images, where the embedding locations are arranged in two dimensional blocks within a tile, the synchronizer determines rotation, scale and translation (origin) of each tile. This may also involve approximating the geometric distortion of the tile by an affine transformation that maps the embedded signal back to its original embedding locations.

To facilitate synchronization, the auxiliary signal may include an explicit or implicit synchronization signal. An explicit synchronization signal is an auxiliary signal separate from the encoded payload that is embedded with the encoded payload, e.g., within the same tile). An implicit synchronization signal is a signal formed with the encoded payload, giving it structure that facilitates geometric/temporal synchronization.

Examples of explicit and implicit synchronization signals are provided in U.S. Pat. Nos. 6,614,914, and 5,862,260, which are each hereby incorporated herein by reference in their entirety.

In particular, one example of an explicit synchronization signal is a signal comprised of a set of sine waves, with pseudo-random phase, which appear as peaks in the Fourier domain of the suspect signal. See, e.g., U.S. Pat. Nos. 6,614,914, and 5,862,260, describing use of a synchronization signal in conjunction with a robust data signal. Also see U.S. Pat. No. 7,986,807, which is hereby incorporated by reference in its entirety.

U.S. Pat. No. 9,182,778, which is hereby incorporated by reference in its entirety, provides additional methods for detecting an embedded signal with this type of structure and recovering rotation, scale and translation from these methods.

Examples of implicit synchronization signals, and their use, are provided in U.S. Pat. Nos. 5,862,260, 6,614,914, 6,625,297, 7,072,490, 9,747,656, which are hereby incorporated by reference in their entirety.

Signal Embedding In Host

Figure 4:
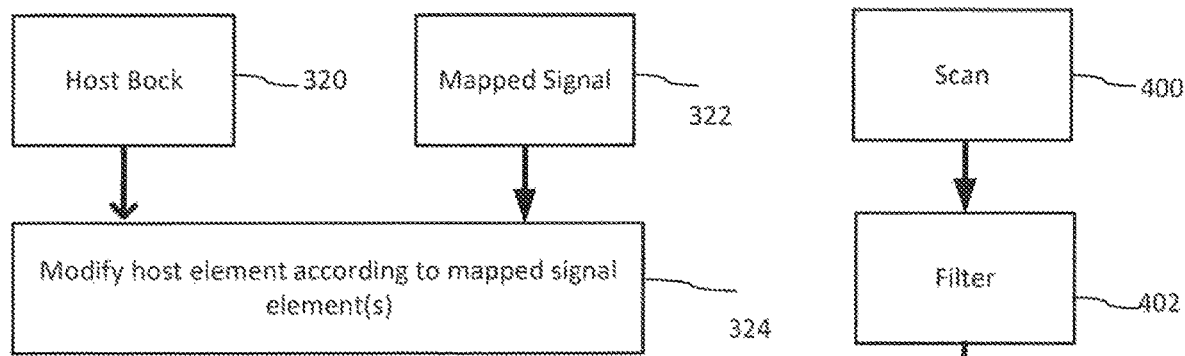
FIG. 4 is a diagram illustrating embedding of an auxiliary signal into host image signal.

FIG. 4 is a diagram illustrating embedding of an auxiliary signal into host signal. As shown, the inputs are a host signal block (e.g., blocks of a host digital image) (320) and an encoded auxiliary signal (322), which is to be inserted into the signal block. The encoded auxiliary signal may include an explicit synchronization component, or the encoded payload may be formulated to provide an implicit synchronization signal. Processing block 324 is a routine of software instructions or equivalent digital logic configured to insert the mapped signal(s) into the host by adjusting the corresponding host signal sample(s) at an embedding location according to the value of the mapped signal element. For example, the mapped signal is added/subtracted from corresponding a sample value, with scale factor and threshold from the perceptual model or like mask controlling the adjustment amplitude. In implementations with an explicit synchronization signal, the encoded payload and synchronization signals may be combined and then added or added separately with separate mask coefficients to control the signal amplitude independently.

Following the construction of the payload, error correction coding is applied to the binary sequence. This implementation applies a convolutional coder at rate ¼, which produces an encoded payload signal of 4096 bits. Each of these bits is modulated onto a binary antipodal, pseudorandom carrier sequence (−1, 1) of length 16, e.g., multiply or XOR the payload bit with the binary equivalent of chip elements in its carrier to yield 4096 modulated carriers, for a signal comprising 65,536 elements. These elements map to the 65,536 embedding locations in each of the 256 by 256 tiles.

An alternative embodiment, for robust encoding on packaging employs tiles of 128 by 128 embedding locations. Through convolutional coding of an input payload at rate ⅓ and subsequent repetition coding, an encoded payload of 1024 bits is generated. Each of these bits is modulated onto a similar carrier sequence of length 16, and the resulting 16,384 signal elements are mapped to the 16,384 embedding locations within the 128 by 128 tile.

There are several alternatives for mapping functions to map the encoded payload to embedding locations. In one, these elements have a pseudorandom mapping to the embedding locations. In another, they are mapped to bit cell patterns of differentially encoded bit cells as described in U.S. patent application Ser. No. 14/724,729 (issued as U.S. Pat. No. 7,747,656). In the latter, the tile size may be increased to accommodate the differential encoding of each encoded bit in a pattern of differential encoded bit cells, where the bit cells corresponding to embedding locations at a target resolution (e.g., 300 DPI).

U.S. Pat. No. 9,635,378 describes methods for inserting auxiliary signals in areas of package and label designs that have little host image variability. These methods are particularly useful for labels, including price change labels and fresh food labels. These signal encoding methods may be ported to the printing sub-system in scales used within fresh food, deli and meat departments to encode GTINs and control flags for variable weight items in the image of a label, which is then printed by the printer sub-system (typically a thermal printer) on the label and affixed to an item.

For an explicit synchronization signal, the mapping function maps a discrete digital image of the synchronization signal to the host image block. For example, where the synchronization signal comprises a set of Fourier magnitude peaks or sinusoids with pseudorandom phase, the synchronization signal is generated in the spatial domain in a block size coextensive with the 256 by 256 tile (or other tile size, e.g., 128 by 128) at target embedding resolution.

Various detailed examples of encoding protocols and processing stages of these protocols are provided in U.S. Pat. Nos. 6,614,914, 5,862,260, and 6,674,876, which are hereby incorporated by reference, and U.S. Pat. Nos. 9,117,268 and 9,635,378, previously incorporated. More background on signaling protocols, and schemes for managing compatibility among protocols, are provided in U.S. Pat. No. 7,412,072, which is hereby incorporated by reference.

One signaling approach, which is detailed in U.S. Pat. Nos. 6,614,914, and 5,862,260, is to map elements to pseudo-random locations within a channel defined by a domain of a host signal. See, e.g., FIG. 9 of U.S. Pat. No. 6,614,914. In particular, elements of a watermark signal are assigned to pseudo-random embedding locations within an arrangement of sub-blocks within a block (referred to as a "tile"). The elements of this watermark signal correspond to error correction coded bits. These bits are modulated onto a pseudo-random carrier to produce watermark signal elements (block 306 of FIG. 3), which in turn, are assigned to the pseudorandom embedding locations within the sub-blocks (block 308 of FIG. 3). An embedder module modulates this signal onto a host signal by increasing or decreasing host signal values at these locations for each error correction coded bit according to the values of the corresponding elements of the modulated carrier signal for that bit.

Figure 5:
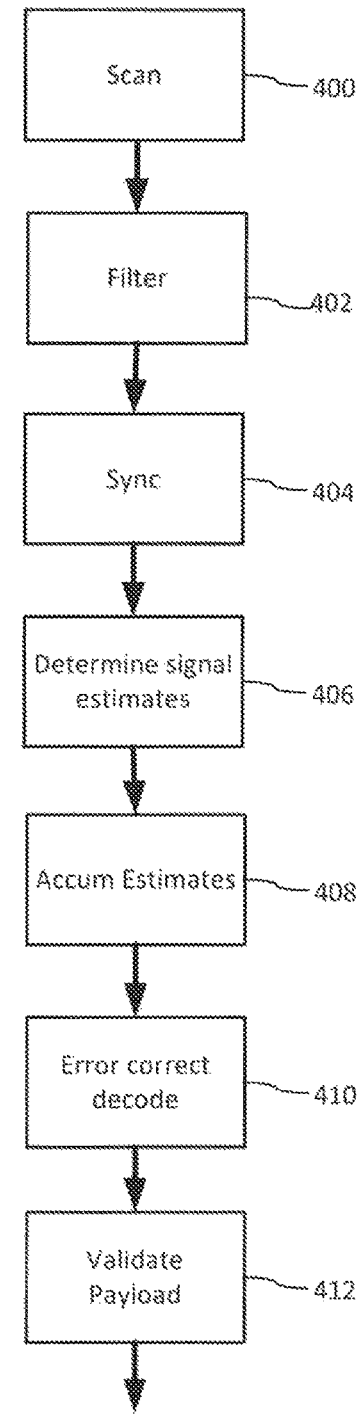
FIG. 5 is a flow diagram illustrating a method for decoding a payload signal from a host image signal.

FIG. 5 is a flow diagram illustrating a method for decoding a payload signal from a host image signal. The frames are captured at a resolution preferably near the resolution at which the auxiliary signal has been encoded within the original image (e.g., 300 DPI, 100 DPI, etc.). An image up-sampling or down-sampling operation may be performed to convert the image frames supplied by the imager to a target resolution for further decoding.

The resulting image blocks supplied to the decoder from these frames may potentially include an image with the payload. At least some number of tiles of encoded signal may be captured within the field of view, if an object with encoded data is being scanned. Otherwise, no encoded tiles will be present. The objective, therefore, is to determine as efficiently as possible whether encoded tiles are present.

In the initial processing of the decoding method, it is advantageous to select frames and blocks within frames that have image content that are most likely to contain the encoded payload. From the image passed to the decoder, the decoder selects image blocks for further analysis. The block size of these blocks is set large enough to span substantially all of a complete tile of encoded payload signal, and preferably a cluster of neighboring tiles. However, because the distance from the camera may vary, the spatial scale of the encoded signal is likely to vary from its scale at the time of encoding. This spatial scale distortion is further addressed in the synchronization process.

For more on block selection, please see U.S. Pat. No. 9,521,291, which is hereby incorporated by reference.

Please also see U.S. Pat. No. 9,922,220, which is hereby incorporated by reference, for more on block selection where processing time is more limited.

The first stage of the decoding process filters the image to prepare it for detection and synchronization of the encoded signal (402). The decoding process sub-divides the image into blocks and selects blocks for further decoding operations. For color images, a first filtering stage converts the input color image signal (e.g., RGB values) to a color channel or channels where the auxiliary signal has been encoded. See, e.g., U.S. Pat. No. 9,117,268, which is hereby incorporated herein by reference in its entirety, for more on color channel encoding and decoding. For an image captured under red illumination by a monochrome scanner, the decoding process operates on this "red" channel sensed by the scanner. Some scanners may pulse LEDs of different color to obtain plural color or spectral samples per pixel as described in U.S. Pat. No. 9,749,607, which is hereby incorporated by reference.

A second filtering operation isolates the auxiliary signal from the host image. Pre-filtering is adapted for the auxiliary signal encoding format, including the type of synchronization employed. For example, where an explicit synchronization signal is used, pre-filtering is adapted to isolate the explicit synchronization signal for the synchronization process.

In some embodiments, the synchronization signal is a collection of peaks in the Fourier domain. Prior to conversion to the Fourier domain, the image blocks are pre-filtered. See, e.g., LaPlacian pre-filter in U.S. Pat. No. 6,614,914. A window function is applied to the blocks and then a transform to the Fourier domain, applying an FFT. Another filtering operation is performed in the Fourier domain. See, e.g., pre-filtering options in U.S. Pat. Nos. 6,988,202, 6,614,914, and 9,182,778, which are hereby incorporated by reference in their entirety.

For more on filters, also see U.S. Pat. No. 7,076,082, which is hereby incorporated by reference in its entirety. This patent describes a multi-axis filter, e.g., an oct-axis filter. Oct axis compares a discrete image sample with eight neighbors to provide a compare value (e.g., +1 for positive difference, −1 or negative difference), and sums the compare values. Different arrangements of neighbors and weights may be applied to shape the filter according to different functions. Another filter variant is a cross shaped filter, in which a sample of interest is compared with an average of horizontal neighbors and vertical neighbors, which are then similarly summed.

Next, synchronization process (404) is executed on a filtered block to recover the rotation, spatial scale, and translation of the encoded signal tiles. This process may employ a log polar method as detailed in U.S. Pat. No. 6,614,914 or least squares approach of U.S. Pat. No. 9,182,778, to recover rotation and scale of a synchronization signal comprised of peaks in the Fourier domain. To recover translation, the phase correlation method of U.S. Pat. No. 6,614,914 is used, or phase estimation and phase deviation methods of U.S. Pat. No. 9,182,778 are used.

Alternative methods perform synchronization on an implicit synchronization signal, e.g., as detailed in U.S. Pat. No. 9,747,656.

Next, the decoder steps through the embedding locations in a tile, extracting bit estimates from each location (406).

This process applies, for each location, the rotation, scale and translation parameters, to extract a bit estimate from each embedding location (406). In particle, as it visits each embedding location in a tile, it transforms it to a location in the received image based on the affine transform parameters derived in the synchronization, and then samples around each location. It does this process for the embedding location and its neighbors to feed inputs to an extraction filter (e.g., oct-axis or cross shaped). A bit estimate is extracted at each embedding location using filtering operations, e.g., oct axis or cross shaped filter (see above), to compare a sample at embedding locations with neighbors. The output (e.g., 1, −1) of each compare operation is summed to provide an estimate for an embedding location. Each bit estimate at an embedding location corresponds to an element of a modulated carrier signal.

The signal decoder estimates a value of each error correction encoded bit by accumulating the bit estimates from the embedding locations of the carrier signal for that bit (408). For instance, in the encoder embodiment above, error correction encoded bits are modulated over a corresponding carrier signal with 16 elements (e.g., multiplied by or XOR with a binary anti-podal signal). A bit value is demodulated from the estimates extracted from the corresponding embedding locations of these elements. This demodulation operation multiplies the estimate by the carrier signal sign and adds the result. This demodulation provides a soft estimate for each error correction encoded bit.

These soft estimates are input to an error correction decoder to produce the payload signal (410). For a convolutional encoded payload, a Viterbi decoder is used to produce the payload signal, including the checksum or CRC. For other forms of error correction, a compatible decoder is applied to reconstruct the payload. Examples include block codes, BCH, Reed Solomon, Turbo codes.

Next, the payload is validated by computing the check sum and comparing with the decoded checksum bits (412). The check sum matches the one in the encoder, of course. For the example above, the decoder computes a CRC for a portion of the payload and compares it with the CRC portion in the payload.

At this stage, the payload is stored in shared memory of the decoder process. The recognition unit in which the decoder process resides returns it to the controller via its interface. This may be accomplished by various communication schemes, such as IPC, shared memory within a process, DMA, etc.

Technology for so-called "sparse" mark encoding (e.g., encoding with variable density to adapt for visual quality and reliability) is described in, e.g., Digimarc's US Published Patent Application Nos. US 2016-0275639 A1, US 2019-0171856 A1, and US 2019-0332840 A1, and PCT international patent application no. PCT/US19/19410, filed Feb. 25, 2019 (published as WO 2019/165364), each of which is hereby incorporated herein by reference in its entirety. A sparse mark may include a pattern of spatial locations where ink is deposited or not (or where an area is engraved or not). For example, a sparse signal may be comprised of ink dots on a light background, such that the signal forms a pattern of subtly darker spatial locations. The signal is designed to be sparse by the spacing apart of the darker locations on the light background. Conversely, the signal may be designed as an array of lighter "holes" on a relatively darker background. In still other cases, the signal may include a pattern of both darker and lighter signal elements.

Sparse data signals can be binary (0,1), trinary (−1,0,1), or other coarse quantization. Sparse signals are typically low density, i.e., less than 50% ink or less than 50% space. Such a signal has maximum robustness at 50%, so any optimal sparse algorithm should increase in robustness as the ink/space density tends toward 50%. Unless otherwise indicated, the term "sparse" as used herein refers to a bitonal code in which 50% or less of the surface contains marking to produce a contrasting mark (e.g., ink on a substrate, or a light void surrounded with contrasting ink). More typically, a sparse mark has less than 30% of the surface so-marked, e.g., 30%-10%, with a print density of 2-15% being most common. (N different levels of print density can be defined. For example, N can be 19, corresponding to ink coverages of 5%, 10%, 15%, . . . 95%. A 5% print density is achieved by selecting the lowest value pixels, e.g., subject to a keep-out distance constraint, until 5% of the pixels have marks. Similarly for 10%, 15%, etc. See FIG. 9 of the WO 2019/165364 publication.)

II. Printing Plate Technology

This section describes examples of printing plates that may be enhanced with encoded signals such as those discussed above in Section I. Construction details, system components and benefits of such are described below in Section III.

Example printing plates are provided by, e.g., MacDermid, under the tradenames of LUX ITP 60 and Digital RAVE. Additionally, flexographic printing plates are described, e.g., in MacDermid's U.S. Pat. Nos. 10,108,087, 10,429,736 and 10,599,035, which are each hereby incorporated herein by reference in its entirety. Examples from these documents include some of the following.

Flexography is a printing technology that uses a printing plate mounted to a printing or plate cylinder. Flexographic printing plates comprising, e.g., photopolymer, are used for printing on a variety of substrates, e.g., such as labels, tags, paper, paperboard stock, corrugated board, films, foils and laminates. For our purposes here, a photopolymer (or light-activated resin) includes a polymer that changes its properties when exposed to light, often in the ultraviolet or visible region of the electromagnetic spectrum.

Figure 6:
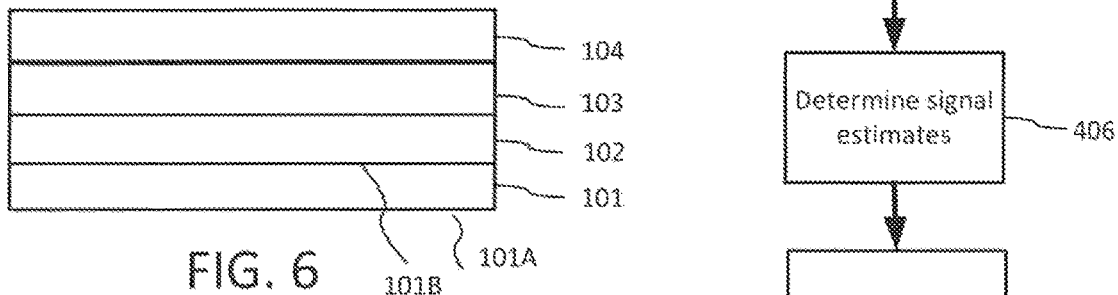
FIG. 6 is a block diagram of a multi-layered printing plate.

Flexographic printing plates can include relief plates with image elements raised above open areas. Generally, such a printing plate is somewhat soft, and flexible enough to wrap around a printing cylinder, and durable enough to print many (sometimes millions) of copies. Such plates offer a number of advantages to the printer, e.g., based on their durability and the ease with which they can be made. With reference to FIG. 6, an example flexographic printing plate includes a multilayered article with a support layer or backing 101; one or more unexposed photocurable layers 102; optionally a protective layer or slip film 103; and optionally, a protective cover sheet 104. Of course, a printing plate may include more or less layers.

The support (or backing) layer 101 provides support to the plate. The support layer 101 can be formed from a transparent or opaque material such as paper, cellulose film, plastic, or metal. Preferred materials include sheets made from synthetic polymeric materials such as polyesters, polystyrene, polyolefins, polyamides, and the like. The support layer 101 includes a bottom side 101A that is not adjacently coupled to another layer such as the photocurable layers 102, and a top side 101B that is adjacently arranged to another layer such as the photocurable lays 102. One example support layer comprises a flexible film of polyethylene terephthalate (PET). As discussed below, a transparent support layer 101 offers many advantages when used in connect with encoded signals.

The photocurable layer(s) 102 can include any of the known polymers, monomers, initiators, reactive and/or non-reactive diluents, fillers, and dyes. As used herein, the term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional relief pattern of cured material. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. Photocurable materials generally cross-link (e.g., cure) and harden through radical polymerization in at least some actinic wavelength region. For our purposes here, "actinic radiation" refers to radiation that is capable of polymerizing, crosslinking or curing the photocurable layer. Actinic radiation includes, for example, amplified (e.g., laser) and non-amplified light, e.g., in the ultraviolet (UV) and violet wavelength regions.

The protective layer or slip film 103 may include a layer that protects the photopolymer from dust and increases its ease of handling. In a conventional ("analog") plate making process, the slip film is transparent to UV light, and the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate.

In a "digital" or "direct to plate" process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are then ablated by exposing the masking layer to laser radiation at a selected wavelength and power of the laser. Examples of laser ablatable layers are disclosed, for example, in U.S. Pat. No. 5,925,500 to Yang, et al., and U.S. Pat. Nos. 5,262,275 and 6,238,837 to Fan, the subject matter of each of which is herein incorporated by reference in its entirety.

Processing steps for forming flexographic printing plates with relief image printing elements may include the following: 1) Image generation, which may be mask ablation for digital "computer to plate" printing plates or negative production for conventional analog plates; 2) Back exposure to create a floor layer in the photocurable layer and establish the depth of relief; 3) Face exposure through the mask (or negative) to selectively crosslink and cure portions of the photocurable layer not covered by the mask, thereby creating the relief image; 4) Development to remove unexposed photopolymer by solvent (including water) or thermal development; and 5) If necessary, post exposure and detackification.

Other processes have been developed whereby photopolymer printing plates are prepared using heat and the differential melting temperature between cured and uncured photopolymer is used to develop the relief image. The basic parameters of this process are described in U.S. Pat. Nos. 7,122,295, 6,773,859, 5,279,697, 5,175,072, in published U.S. patent publication Nos. U.S. 2006/0124009 and, U.S. 2010/0119978, and in WO 01/88615, WO 01/18604, and EP 1239329, each of which are incorporated herein by reference in its entirety. These processes allow for the elimination of development solvents and the lengthy plate drying times needed to remove the solvent.

III. Encoding Signals on Printing Plates to Enable Identification, Tracking and Management Identifying, tracking and managing printing plates throughout their expected lifecycle is critical to ensure quality control, proper use, storage, and accurate plate impression monitoring. For example, once received from a manufacture, a printing plate is formed to include 3D relief printing elements, inspected, mounted for printing on a press, unmounted, cleaned, and stored for future print runs. The printing plate needs to be tracked, managed, maintained, looked after and monitored throughout this process.

Embodiment One

An indelible identifier—carried by an encoded signal and, in this first embodiment, printed, engraved, etched or ablated within or on the printing plate itself—provides a backbone to uniquely and persistently identify a printing plate throughout its lifecycle.

A printing plate is assigned a unique identifier during the manufacturing process or shortly thereafter. The identifier is preferably carried by an encoded signal as discussed in Section I, e.g., a so-called sparse mark having a signal element density adapted for visual quality and reliability. In this case, we prefer to weight robustness over visual quality. Once formed, the sparse mark pattern is printed (e.g., using an inkjet printer) or laser etched/engraved on support layer or backing 101, and in this embodiment, preferably on the bottom side 101A (also called "outside"). In a first implementation using inkjet, we print using one or more inks with a strong adhesion property, e.g., a UV curable ink. A first set of UV curable inks is the Uvijet KV, KN and/or KO inks provide by FujiFilm, North America Corporation, Graphic Systems Division, with offices in Tempe, Ariz., USA, including product numbers KV052 Yellow, KV867 Magenta, KV215 Cyan, KV004 Black, KV021 White, K0215 Cyan, KO052 Yellow, KO004 Black, KO867 Magenta, KN215 Cyan, KN052 Yellow, KNO04 Black, KN867 Magenta, KN335 Light Magenta, and KN255 Light Cyan. The Uvijet KV, KN and/or KO inks can be printed using, e.g., Fujifilm Acuity UV inkjet printers or with piezo drop-on-demand printheads. See also the printhead discussed in U.S. Pat. No. 9,227,394, which is hereby incorporated herein by reference. Other UV curable inks are provided by, e.g., AGFA with offices in Elmwood Park, N.J., USA.

Visually, the sparse mark pattern may look like a random pattern of ink dots occupying a some or all of the bottom side 101A (see FIG. 7A, corners) The identifier itself includes a plurality of n-bits, e.g., 16-256 bits, which may be further error corrected and expanded as discussed above. Also recall that the payload is repeated, e.g., tiled, within the encoded signal. So there is an advantage of printing, engraving or etching a large portion (30-75%, and even more preferably, 50-90%) of the surface area of bottom side 101A with the sparse mark signal. A detector need not analyze image data corresponding to the entire bottom side 101A, but only portion of such to grab a single instance of such a tile. Thus, this allows for a quick image capture of only a portion of the bottom side 101A to decode the carried identifier.

Repeating the signal on the plate also facilitates plate association in the event that a plate is cut or otherwise divided and image formation. For example, the plate may include duplicate images that are separated prior to attachment to a print cylinder. Or, if portions are trimmed from the plate, the portions can be identified with their host plate.

In other implementations, the sparse mark is printed, engraved, ablated or etched into one or more predetermined locations of the bottom side. For example, the sparse mark is provided in one or more corner areas of bottom side 101A.

Figure 7A:
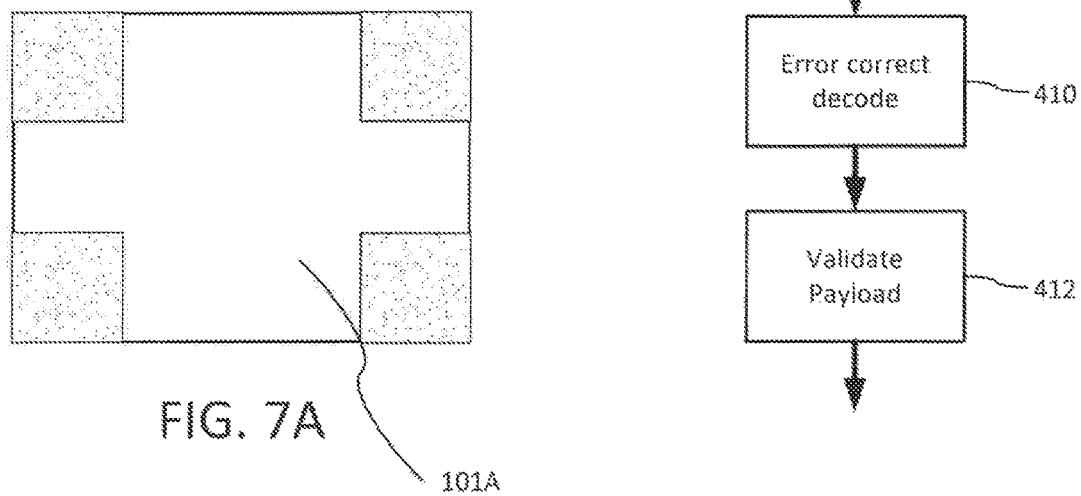
FIG. 7A shows a bottom up view of the FIG. 6 printing plate with machine-readable indicia on surface 101A.

FIG. 7A shows this arrangement, from the viewpoint of looking at the printing plate from the bottom side 101A, with sparse marking in the corner areas.

The identifier is readable from analysis of image data representing some or all of the encoded signal on the bottom side 101A. For example, image data captured by an Apple iPhone or an Android powered device takes a picture or video of a portion of the printing plate. This captured image data can be processed as the encoded host signal 240 in FIG. 2 and analyzed accordingly to validate the identifier, e.g., as discussed with reference to FIG. 5.

Figure 8:
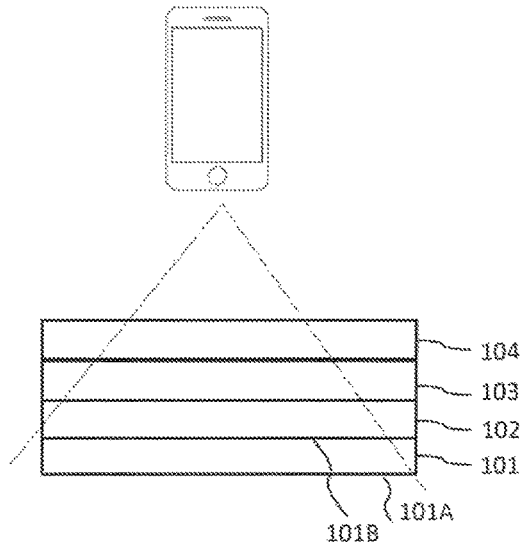
FIG. 8 shows image capture of an encoded signal through the FIG. 6 printing plates
Figure 9:
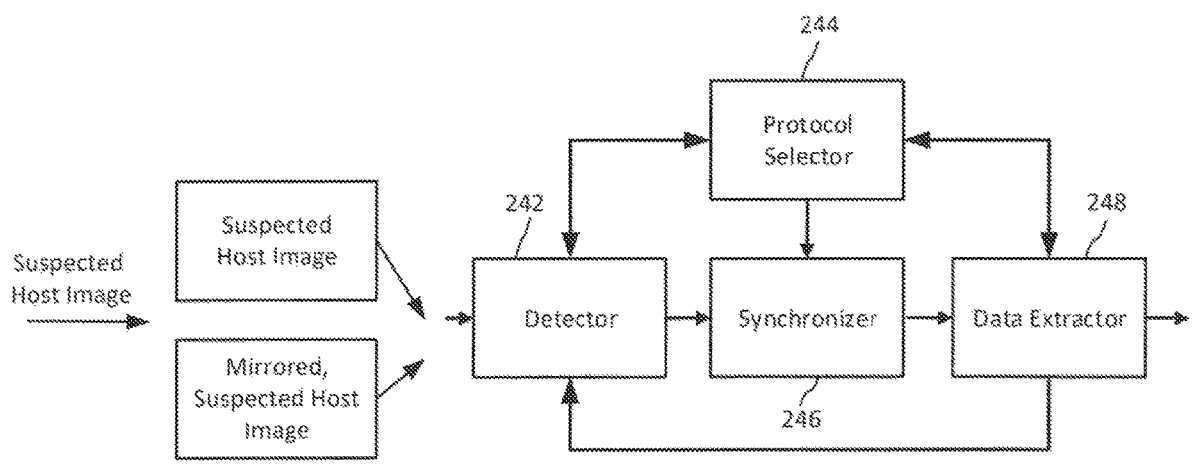
FIG. 9 is a modified version of the FIG. 2 signal decoder.

Our preferred printing plate for this first embodiment includes all transparent materials for layers 101-104. This allows for detection from image data captured of the sparse mark signal from the top side (FIG. 8), through the transparent layered plate structure 104-101, to capture the printing, engraving, ablation or etching on the bottom side 101A. Preferably, the sparse mark is also detectable from image data captured from the bottom side 101A. To accommodate reading from both sides, a signal detector (or a preprocessing module) analyzes two or more versions of the image data as shown in FIG. 9. This is because the signal will appear reversed in a top capture if printed for detection on the bottom side 101A, and vice versa. Thus, the original version of the image data and a mirror version of the image data are analyzed to decode the signal. The detection can be staged or processed in parallel. For example, if an unsuccessful decode results from the original version of the image data, the mirrored version of the image data is processed. Or, if a more likely image capture scenario is through the printing plate, the mirrored version can be processed first and then the original version. Parallel processing of both image capture versions is also envisioned. (For our purposes here, a mirror image version may include a horizontal flip, a vertical flip, or both.)

The unique identifier may include one or more fields, and can be used as an index into a data repository to access related information. For example, the identifier may carry plate identifier and or other information:

TABLE 1

| Identifier Information | | | |
|---|---|---|---|
| Field 1 | Field 2 | Field 3 | Field 4 |
| Plate ID | Plate Manufacture | Production Data, Production Date and/or Plate Type | Lot Number |

The plate's unique identifier provides a backbone for a data management system. For example, the unique identifier is associated with a data record to manage the lifecycle of its corresponding plate. The data record may provide the following information, which can be updated to reflect the status of a printing plate. For example, the record may include one or more of the following fields:

TABLE 2

| Information associated with Printing Plate | | | | | | | |
|---|---|---|---|---|---|---|---|
| Field 1 | Field 2 | Field 3 | Field 4 | Field 5 | Field 6 | Field 7 | Field 8 |
| Plate ID | Plate Manufacture | Production Date | Design or Job ID | Customer Information | Impression Count | Current Location and/or check in status | GTIN |

Consider a system using such technology. The system includes or communicates with a plurality of an image capture devices, e.g., an iOS or Android smartphones, tablets or scanners. Such devices include one or more cameras, e.g., a CMOS or CCD based camera arrays. An image capture device includes or communicates with a signal decoder, e.g., as discusses above in Section I. The system also includes a data record system, having a plurality of configurable data records, and a user interface to allow user access or creation of such data records. The data record system can be maintained on a cloud-based network, accessible via cell service or the internet, or housed locally on a company server (and accessible via, e.g., WIFI).

At a printing press, a new printing plate is unpackaged, and its encoded signal is scanned with the image capture device (e.g., imagery is captured representing a portion of the printed sparse mark pattern). The decoder analyzes the captured imagery to validate a unique identifier carried by the sparse mark, and provides such to the data record system. The user interface facilitates data entry of information associated with a print run using that printing plate. For example, print job, customer information, color or ink information, number of impressions, etc. The system can be configured to display or otherwise provide access to a data record associated with an identifier each time an identifier is received from an image capture device.

The data record system allows real-time tracking of a printing plate. For example, an operator scans the plate to obtain the identifier prior to and/or after the plate enters a station. The identifier is used to access an associated data record, and the operator may be presented with a "check-in/check-out" interface, which allows them to scroll or otherwise select an appropriate station (e.g., plate forming, inspection, plate mounting, plate cleaning) or storage location (row/rack or other storage area). The data record can be constructed to follow a process flow, where station check in will be prohibited unless it was first checkout of a previous station. Later on, when looking for a plate or print job, the status can be queried within the data record system to find the last scanned location.

The data record also provides an updateable field to track print impressions, which helps manage the number of prints made from a plate. After a print run, the plate can be rescanned to access the data record (or the data record otherwise accessed) and the number of print impressions can be recorded. (In some cases, the printing press provides this information directly to the data record.) The data record can also accommodate expiration information, to notify a user if a plate has reached a predetermined number of impressions (e.g., 1-2 million impressions) or has extended use beyond a shelf life date.

Embodiment Two

This $2^{nd}$ Embodiment incorporates the details from the $1^{st}$ Embodiment unless noted otherwise.

Instead of printing an encoded signal on a flexographic photopolymer printing plate as in Embodiment one, the encoded signal is formed in relief within the plate itself. Recall from above that an image is used to guide photo-exposure of a printing plate to form 3D relief printing elements thereon. That image may include a printed image region in which artwork, text, graphics, etc. may be printed. The printed image region includes all the stuff that will be seen, e.g., when a resulting print is used for packaging or labels. The image may also include one or more print control strips located outside the printed image region. In a first implementation of this $r^{nd}$ Embodiment, the image includes (or is updated to include) an encoded signal within or adjacent to the control strip. For example, the technology described above with respect to FIGS. 1 and 3, and with the sparse mark description, can be used to generate a signal. The printing plate will include the encoded signal when it is formed based on the image. Thereafter, an image capture device can capture an image of the encoded signal within the printing plate to obtain the identifier.

In a second implementation of this $2^{nd}$ Embodiment, the encoded signal is formed within the printed image region. In this case, if the image to be carried by the printing plate already includes an encoded signal, such an encoded signal can be used as a part of or other associated with the unique identifier.

There are advantages to having the encoded signal formed within the processed printing plate. One example is surviv-ability of the signal through multiple cycles of a printing plate cleaning process. Since the encoded signal is repre-sented within the formed printing plate by relief signal elements, just like artwork, images and text, the encoded signal should wear at relatively the same pace as the artwork. Whereas ink may degrade after several cleanings, the formed in encoded signal should remain consistently robust with other formed relief print elements.

Embodiment Three

This 3rd Embodiment incorporates the details from the $1^{st}$ and $2^{nd}$ Embodiments unless noted otherwise.

The unique identifier is associated with or serves as a serialization ID, and can be applied (e.g., via inkjet or laser ablation) at time of manufacture, prior to shipping or upon use at a printing press. The techniques discussed in Digi-marc's U.S. Pat. No. 10,235,731 for payload and orientation signal usage for digital watermark serialization can be used here. The U.S. Pat. No. 10,235,731 patent is hereby incor-porated here by reference in its entirety. Serialization allows for precise plate tracking and inventory control.

Serialization within a plate can be granular, e.g., different sections of the plate can include different payloads. Or the different sections may include the same base identifier, but include a unique subsection identifier. A payload scheme example is provided below for 3 unique subsections:

| Plate ID | Subsection ID |
| --- | --- |
| 1234567890 | A |
| 1234567890 | B |
| 1234567890 | C |

Instead of using subsection identifiers, the orientation component itself may convey position information within the plate. For example, the orientation signal may establish a base spatial reference point on the plate, e.g., at the top left or right corner of the plate (or at the center of the plate, etc.). The relative position of the orientation signal within a tile can then provide spatial location information when decoded. So if pieces of the plate are trimmed or otherwise separated, the orientation signal can be decoded and used to obtain relative spatial position of the tile.

Embodiment Four

This 4th Embodiment incorporates the details from the $1^{st}$ and $3^{rd}$ Embodiments unless noted otherwise.

A printing plate is assigned a unique identifier during the manufacturing process. The identifier is preferably carried by an encoded signal as discussed in Section I, e.g., a so-called sparse mark having a signal element density adapted for visual quality and reliability. In this case, we prefer to weight robustness over visual quality. Once formed, the sparse mark pattern is printed (e.g., using an inkjet printer) or laser etched/engraved on support layer or backing 101, and in this 4th Embodiment, on the top side 101B (also called the "inside") of layer 101. That is, printing occurs on the inside of support layer, e.g., a polyester film, itself, and then a photocurable material is extruded or otherwise provided on top of the printing.

In a first implementation using inkjet, and prior to extrud-ing or otherwise providing photocurable layer(s) 102 onto top side 101B, we print using one or more inks with a strong adhesion property, e.g., a UV curable ink. A first set of UV curable inks is the Uvijet KV, KN and/or KO inks provide by FujiFilm, North America Corporation, Graphic Systems Division, with offices in Tempe, Ariz. USA, including prod-uct numbers KV052 Yellow, KV867 Magenta, KV215 Cyan, KV004 Black, KV021 White, KO215 Cyan, KO052 Yellow, KO004 Black, KO867 Magenta, KN215 Cyan, KNO52 Yellow, KN004 Black, KN867 Magenta, KN335 Light Magenta, and KN255 Light Cyan. The Uvijet KV, KN and/or KO inks can be printed using, e.g., Fujifilm Acuity UV inkjet printers or with piezo drop-on-demand print-heads. See also the printhead discussed in U.S. Pat. No. 9,227,394, which is hereby incorporated herein by reference. Other UV curable inks are provided by, e.g., AGFA with offices in Elmwood Park, N.J., USA. A UV curable ink then can be cured on the top side 101B. In second implementa-tion, and prior to extruding or otherwise providing photo-curable layer(s) 102 onto top side 101B, an inkjet prints with non-UV curable ink. The arrangement of the code with layers of material on both sides may protect the code during its lifecycle.

Figure 7B:
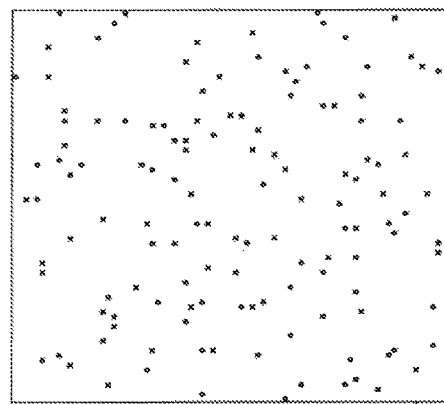
FIG. 7B shows a top down view of the FIG. 6 printing plate with machine-readable indicia on surface 101B.

Visually, the sparse mark pattern may look like a random pattern of ink dots occupying a some or all of the top side 101B. FIG. 7B shows this arrangement, from the viewpoint of looking at the printing plate from the top side 101B, perhaps even through layers 103 and 104. In other implementations, the sparse mark is printed, engraved, ablated or etched into one or more predetermined locations of the bottom side 101B. For example, the sparse mark is provided in one or more corner areas of top side 101B.

The identifier is readable from analysis of image data representing some or all of the encoded signal on the top side 101B. For example, image data captured by an Apple iPhone or an Android powered device takes a picture or video of a portion of the printing plate. This captured image data can be processed as the encoded host signal 240 in FIG. 2 and analyzed accordingly to validate the identifier, e.g., as discussed with reference to FIG. 5.

Our preferred printing plate for this $4^{th}$ Embodiment includes all transparent materials for layers 101-104. This allows for detection of a code from image data captured of the sparse mark signal (FIG. 8), through the transparent layered plate structure 104-101, to capture the printing, engraving, ablation or etching on the top side 101B. Preferably, the sparse mark printed on top layer 101B is also detectable from image data captured from the bottom side 101A. To accommodate reading from both sides, a signal detector (or a preprocessing module) analyzes two or more versions of the image data as shown in FIG. 9. This is because the signal will appear reversed in a bottom side capture if printed for detection on the top side 101B, and vice versa. Thus, the original version of the image data and a mirror version of the image data are analyzed to decode the signal. The detection can be staged or processed in parallel. For example, if an unsuccessful decode results from the original version of the image data, the mirrored version of the image data is processed. Or, if a more likely image capture scenario is through the printing plate, the mirrored version can be processed first and then the original version. Parallel processing of both image capture versions is also envisioned. (For our purposes here, a mirror image version may include a horizontal flip, a vertical flip, or both.)

There are many advantages to printing, engraving or ablating a machine-readable code on the top side of layer 101 (i.e., top side 101B). For example, during a cleaning, mounting or handling stage, the code is protected and insulated by plate material(s), thus avoiding direct contact and preventing damage and wear. Another benefit is that the encoded signal is inherent within the plate when a customer receives it from a plate manufacturer.

IV. Operating Environments for Signal Encoding Decoding, and Data Record System

The components and operations of the various described embodiments and implementations shown in figures and/or discussed in text above, can be implemented in modules. Notwithstanding any specific discussion of the embodiments set forth herein, the term "module" may refer to software, firmware and/or circuitry configured to perform any of the methods, processes, algorithms, functions or operations described herein. Software may be embodied as a software package, code, instructions, instruction sets, or data recorded on non-transitory computer readable storage mediums. Software instructions for implementing the detailed functionality can be authored by artisans without undue experimentation from the descriptions provided herein, e.g., written in C, C++, Objective-C, and C#, Ruby, MatLab, Visual Basic, Java, Python, Tcl, Perl, Scheme, and assembled in executable binary files, etc., in conjunction with associated data. Firmware may be embodied as code, instructions or instruction sets or data that are hard-coded (e.g., nonvolatile) in memory devices. As used herein, the term "circuitry" may include, for example, singly or in any combination, hard-wired circuitry, programmable circuitry such as one or more computer processors comprising one or more individual instruction processing cores, parallel processors, state machine circuitry, or firmware that stores instructions executed by programmable circuitry.

Applicant's work also includes taking the scientific principles and natural laws on which the present technology rests and tying them down in particularly defined implementations. For example, the systems and methods described with reference to FIGS. 1-5, 8 and 9, sparse marks, and Table 2. One such realization of such implementations is electronic circuitry that has been custom-designed and manufactured to perform some or all of the component acts, as an application specific integrated circuit (ASIC).

To realize such implementations, some or all of the technology is first implemented using a general purpose computer, using software such as MatLab (from MathWorks, Inc.). A tool such as HDLCoder (also available from MathWorks) is next employed to convert the MatLab model to VHDL (an IEEE standard, and doubtless the most common hardware design language). The VHDL output is then applied to a hardware synthesis program, such as Design Compiler by Synopsis, HDL Designer by Mentor Graphics, or Encounter RTL Compiler by Cadence Design Systems. The hardware synthesis program provides output data specifying a particular array of electronic logic gates that will realize the technology in hardware form, as a special-purpose machine dedicated to such purpose. This output data is then provided to a semiconductor fabrication contractor, which uses it to produce the customized silicon part. (Suitable contractors include TSMC, Global Foundries, and ON Semiconductors.)

Another specific implementation of the present disclosure includes aspects of the data record system hosted on a specifically configured smartphone (e.g., iPhone 11 or Android device) or other mobile device, such phone or device. The smartphone or mobile device may be configured and controlled by software (e.g., an App or operating system) resident on the smartphone device. Still another specific implementation of the present disclosure includes aspects of the data record system operating in a cloud environment, e.g., Amazon Cloud or Microsoft Azure environments. Multiple processors can be used to reduce overall processing time.

The methods, processes, components, technology, apparatus and systems described above may be implemented in hardware, software or a combination of hardware and software. For example, the color managed embedding and optimizations may be implemented in software, firmware, hardware, combinations of software, firmware and hardware, a programmable computer, electronic processing circuitry, digital signal processors (DSP), FPGAs, graphic processing units (CPUs), a programmable computer, electronic processing circuitry, and/or by executing software or instructions with a one or more processors including parallel processors, multi-core processor(s) and/or other multi-processor configurations.

Concluding Remarks

Having described and illustrated the principles of the technology with reference to specific implementations, it will be recognized that the technology can be implemented in many other, different, forms. To provide a comprehensive disclosure without unduly lengthening the specification, applicant hereby incorporates by reference each of the above referenced patent documents in its entirety.

The particular combinations of elements and features in the above-detailed embodiments are exemplary only; the interchanging and substitution of these teachings with other teachings in this and the incorporated-by-reference patents and documents are also contemplated.

What is claimed is:

1. A flexographic, photopolymer printing plate having a plurality of transparent layers, the plurality of transparent layers including a support layer and a photocurable layer, in which the support layer and the photocurable layer each comprise a bottom side and a top side, with the top side of the support layer being adjacently arranged with the bottom layer of the photocurable layer, the flexographic, photopolymer printing plate further comprising an encoded signal printed with UV curable ink or laser ablated therein, the encoded signal arranged in a pattern on the bottom side of the support layer, the encoded signal comprising an orientation signal component and a plural-bit message component, in which the plural-bit message component is detectable from imagery representing the pattern captured through the top side of the photocurable layer and detectable from imagery representing the pattern captured from the bottom side of the support layer.

2. The flexographic, photopolymer printing plate of claim 1 in which the photocurable layer comprises an unexposed photocurable layer.

3. The flexographic, photopolymer printing plate of claim 1 in which the orientation signal component comprises a pattern detectable in a transform domain.

4. The flexographic, photopolymer printing plate of claim 1 in which the pattern comprises a sparse mark pattern, in which elements of the sparse mark pattern occur when the orientation component and the message component including cooperating components.

5. The flexographic, photopolymer printing plate of claim 1 in which the plurality of transparent layers further comprise a protective layer comprising a top side and a bottom side, with the bottom side of the protective layer adjacently arranged with the top side of the photocurable layer, and in which the plural-hit message component is detectable from imagery representing the pattern captured through the top side of the protective layer and detectable from imagery representing the pattern captured from the bottom side of the support layer.

6. The flexographic, photopolymer printing plate of claim 1 in which the plural-bit message component comprises a plurality of data fields comprising at least a plate identifier.

7. The flexographic, photopolymer printing plate of claim 1 in which the photocurable layer comprises multiple layers.

8. The flexographic, photopolymer printing plate of claim 1 in which the UV curable ink is printed with piezo drop on-demand printheads.

9. The flexographic, photopolymer printing plate of claim 1 in which encoded signal is redundantly printed or laser ablated on the bottom side of the support layer, with each redundantly instance of the encoded signal comprising the orientation component and the plural-bit message component.

10. A flexographic, photopolymer printing plate having a plurality of transparent layers, the plurality of transparent layers including a support layer and a photocured layer, in which the support layer and the photocured layer each comprise a bottom side and a top side, with the top side of the support layer being adjacently arranged with the bottom layer of the photocured layer, the flexographic, photopolymer printing plate further comprising an encoded signal carried with raised image elements in the photocured layer, the encoded signal arranged in a pattern and comprising an orientation signal component and a plural-bit message component, in which the plural-bit message component is detectable from imagery representing the pattern captured through the top side of the photocured layer and detectable front imagery representing the pattern captured from the bottom side of the support layer.

11. The flexographic, photopolymer printing plate of claim 10 in which the encoded signal is carried with raised image elements and open areas within the photocured layer.

12. The flexographic, photopolymer printing plate of claim 10 in which encoded signal is formed in or adjacent to a control strip region outside of an image region of the printing plate.

13. The flexographic, photopolymer printing plate of claim 10 in which the orientation signal component comprises a pattern detectable in a transform domain.

14. The flexographic, photopolymer printing plate of claim 10 in which the pattern comprises a sparse mark pattern, in which elements of the sparse mark pattern occur when the orientation component and the message component including cooperating components at the same spatial location.

15. The flexographic, photopolymer printing plate of claim 10 in which encoded signal is redundantly provided within the photocured layer, with each redundantly instance of the encoded signal comprising the orientation component and the plural-bit message component.

16. A method for tracking a printing plate of claim 1, including;
    using a camera system, capturing imagery the flexographic, photopolymer printing plate;
    analyzing captured imagery to decode the plural-bit message component, in which said analyzing utilizes the orientation component to resolve scale and orientation of the encoded signal;
    accessing a data record with the plural-bit message component; and
    through a graphical user interface updating the data record to reflect station location, print impression count, print job or customer information.

17. A method for tracking a printing plate of claim 10, including:
    using a camera system, capturing imagery the flexographic photopolymer printing plate;
    analyzing captured imagery to decode the plural-bit message component, in which said analyzing utilizes the orientation component to resolve scale and orientation of the encoded signal;
    accessing a data record with the plural-bit message component; and
    through a graphical user interface updating the data record to reflect station location, print impression count, print job or customer information.

18. A flexographic, photopolymer printing plate having a plurality of transparent layers, the plurality of transparent layers including a support layer and a photocurable layer, in which the support layer and the photocurable layer each comprise a bottom side and a top side, with the top side of the support layer being adjacently arranged with the bottom layer of the photocurable layer, the flexographic, photopolymer printing plate further comprising an encoded signal printed with UV curable ink or laser ablated therein, the encoded signal arranged in a pattern on the top side of the support layer, the encoded signal comprising an orientation signal component and a plural-bit message component, in which the plural-bit message component is detectable from imagery representing the pattern captured through the top side of the photocurable layer and detectable from imagery representing the pattern captured from the bottom side of the support layer.

19. The flexographic, photopolymer printing plate of claim 18 in which the photocurable layer comprises an unexposed photocurable layer.

20. The flexographic, photopolymer printing plate of claim 18 in which the orientation signal component comprises a pattern detectable in a transform domain.

21. The flexographic, photopolymer printing plate of claim 18 in which the pattern comprises a sparse mark pattern, in which elements of the sparse mark pattern occur when the orientation component and the message component including cooperating components, and in which for an area including the sparse mark pattern, the sparse mark pattern occupies less than 50% of the surface within the area.

22. The flexographic photopolymer printing plate of claim 18 in which the plurality of transparent layers further comprise a protective layer comprising a top side and a bottom side, with the bottom side of the protective layer adjacently arranged with the top side of the photocurable layer, and in which the plural-bit message component is detectable from imagery representing the pattern captured through the top side of the protective layer and detectable from imagery representing the pattern captured from the bottom side of the support layer.

23. The flexographic, photopolymer printing plate of claim 18 in which the plural hit message component comprises a plurality of data fields comprising at least a plate identifier.

24. The flexographic, photopolymer printing plate of claim 18 in which the photocurable layer comprises multiple layers.

25. The flexographic, photopolymer printing plate of claim 18 in which the UV curable ink is printed with piezo drop on-demand printheads.

26. The flexographic, photopolymer printing plate of claim 18 in which redundant instances of the encoded signal are printed or laser ablated on the top side of the support layer, with each redundant instance of the encoded signal comprising the orientation component and the plural-bit message component.

* * * * *